(12) United States Patent
Mustafa et al.

(10) Patent No.: US 11,186,910 B2
(45) Date of Patent: Nov. 30, 2021

(54) APPARATUS FOR MULTI-FLOW PRECURSOR DOSAGE

(71) Applicant: Applied Materials, Inc., Santa Clara, CA (US)

(72) Inventors: Muhannad Mustafa, Santa Clara, CA (US); Muhammad M. Rasheed, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 167 days.

(21) Appl. No.: 16/568,612

(22) Filed: Sep. 12, 2019

(65) Prior Publication Data

US 2020/0087789 A1 Mar. 19, 2020

Related U.S. Application Data

(60) Provisional application No. 62/731,801, filed on Sep. 14, 2018.

(51) Int. Cl.
| | | |
|---|---|---|
| *C23C 16/40* | (2006.01) | |
| *C23C 16/455* | (2006.01) | |
| *H01L 21/67* | (2006.01) | |
| *H01L 21/02* | (2006.01) | |

(52) U.S. Cl.
CPC .. *C23C 16/45565* (2013.01); *C23C 16/45544* (2013.01); *H01L 21/0228* (2013.01); *H01L 21/67017* (2013.01); *H01L 21/67253* (2013.01)

(58) Field of Classification Search
CPC ........ C23C 16/45565; C23C 16/45544; C23C 16/45525; H01L 21/0228; H01L 21/67253; H01L 21/67017; H01L 21/02205; H01L 21/67276

USPC ........... 118/715; 156/345.33, 345.34
See application file for complete search history.

(56) References Cited

U.S. PATENT DOCUMENTS

| | | | |
|---|---|---|---|
| 5,451,290 A | | 9/1995 | Salfelder |
| 5,453,124 A | * | 9/1995 | Moslehi ............ C23C 16/45561 118/715 |
| 5,496,408 A | * | 3/1996 | Motoda ............... C23C 16/4481 118/715 |
| 5,500,256 A | * | 3/1996 | Watabe ............. C23C 16/45574 427/579 |
| 6,050,506 A | | 4/2000 | Guo et al. |
| 6,086,677 A | | 7/2000 | Umotoy et al. |
| 6,302,964 B1 | | 10/2001 | Umotoy et al. |
| 6,620,289 B1 | | 9/2003 | Yan et al. |
| 6,647,993 B2 | | 11/2003 | Shang et al. |

(Continued)

FOREIGN PATENT DOCUMENTS

| | | |
|---|---|---|
| JP | H08055802 A | 2/1996 |
| JP | 2001358135 A | 12/2001 |

(Continued)

OTHER PUBLICATIONS

PCT International Search Report and Written Opinion in PCT/US2019/050983 dated Jan. 28, 2020, 11 pages.

*Primary Examiner* — Rudy Zervigon
(74) *Attorney, Agent, or Firm* — Servilla Whitney LLC

(57) ABSTRACT

Provided are gas distribution apparatus with a delivery channel having an inlet end, an outlet end and a plurality of apertures spaced along the length. The delivery channel is separated into a plurality of zones by partitions. Each of the plurality of zones has an inlet and an outlet.

20 Claims, 14 Drawing Sheets

(56) References Cited

U.S. PATENT DOCUMENTS

| | | | |
|---|---|---|---|
| 6,793,733 | B2 | 9/2004 | Janakiraman et al. |
| 6,827,815 | B2 | 12/2004 | Hytros et al. |
| 6,983,892 | B2 | 1/2006 | Noorbakhsh et al. |
| 7,491,430 | B2* | 2/2009 | Ishizaka ............... C23C 16/36 427/569 |
| 7,674,394 | B2* | 3/2010 | Paterson ........... H01J 37/32082 216/59 |
| 7,976,631 | B2 | 7/2011 | Burrows et al. |
| 8,402,845 | B2* | 3/2013 | Dedontney .......... B01J 19/0046 73/865.9 |
| 8,955,547 | B2* | 2/2015 | Gungor ..................... F17C 1/00 137/597 |
| 9,109,754 | B2* | 8/2015 | Yudovsky ................. F17D 3/00 |
| 9,353,440 | B2* | 5/2016 | Ge ....................... B08B 9/0325 |
| 10,167,553 | B2* | 1/2019 | Rasheed ............... C23C 16/455 |
| 10,472,716 | B1* | 11/2019 | Shankar ............. C23C 16/45578 |
| 10,519,546 | B2* | 12/2019 | Jallepally ........... C23C 16/455 |
| 2001/0027026 | A1 | 10/2001 | Dhindsa et al. |
| 2003/0124842 | A1 | 7/2003 | Hytros et al. |
| 2003/0172872 | A1 | 9/2003 | Thakur et al. |
| 2004/0003777 | A1 | 1/2004 | Carpentet et al. |
| 2004/0082251 | A1 | 4/2004 | Bach et al. |
| 2004/0127067 | A1 | 7/2004 | Dunham |
| 2005/0092247 | A1 | 5/2005 | Schmidt et al. |
| 2005/0173569 | A1 | 8/2005 | Noorbakhsh et al. |
| 2006/0021703 | A1 | 2/2006 | Umotoy et al. |
| 2007/0022954 | A1 | 2/2007 | Iizuka et al. |
| 2007/0181255 | A1* | 8/2007 | Hayasaka ........ C23C 16/45561 156/345.33 |
| 2007/0247075 | A1* | 10/2007 | Kim ..................... H01J 37/321 315/111.21 |
| 2007/0249173 | A1* | 10/2007 | Kim ................. H01J 37/32091 438/711 |
| 2007/0251642 | A1* | 11/2007 | Bera ................... H01L 21/3065 156/345.26 |
| 2007/0251917 | A1* | 11/2007 | Bera ................ H01J 37/32449 216/58 |
| 2007/0251918 | A1* | 11/2007 | Bera .................... H01J 37/321 216/58 |
| 2007/0254483 | A1* | 11/2007 | Bera ................... H01J 37/3244 438/689 |
| 2007/0254486 | A1* | 11/2007 | Bera ................... H01J 37/3266 438/706 |
| 2008/0178805 | A1* | 7/2008 | Paterson ........... H01J 37/32357 118/723 I |
| 2008/0179011 | A1* | 7/2008 | Collins ............. C23C 16/45574 156/345.44 |
| 2009/0056626 | A1 | 3/2009 | Thakur et al. |
| 2009/0095221 | A1* | 4/2009 | Tam ...................... C23C 16/34 118/715 |
| 2009/0095222 | A1* | 4/2009 | Tam ...................... C23C 16/34 118/723 R |
| 2009/0117746 | A1* | 5/2009 | Masuda ........... H01L 21/67069 438/710 |
| 2009/0159002 | A1 | 6/2009 | Bera et al. |
| 2009/0159213 | A1* | 6/2009 | Bera ................... H01J 37/3244 156/345.34 |
| 2009/0272492 | A1* | 11/2009 | Katz ................... H01J 37/3244 156/345.34 |
| 2010/0075066 | A1 | 3/2010 | Ueda et al. |
| 2011/0011338 | A1 | 1/2011 | Chuc et al. |
| 2013/0098477 | A1* | 4/2013 | Yudovsky .......... C23C 16/45536 137/507 |
| 2015/0176126 | A1* | 6/2015 | Ge .................... C23C 16/45574 137/240 |
| 2016/0273108 | A1 | 9/2016 | Ge et al. |
| 2017/0283947 | A1* | 10/2017 | Rasheed ............... C23C 16/509 |
| 2020/0087789 | A1* | 3/2020 | Mustafa ........... C23C 16/45544 |
| 2021/0187521 | A1* | 6/2021 | Mustafa ................. B05B 1/185 |

FOREIGN PATENT DOCUMENTS

| | | |
|---|---|---|
| JP | 2007005491 A | 1/2007 |
| JP | 2011086776 A | 4/2011 |
| KR | 20100055617 A | 5/2010 |
| KR | 20100064341 A | 6/2010 |
| WO | 2011009002 A2 | 1/2011 |

* cited by examiner

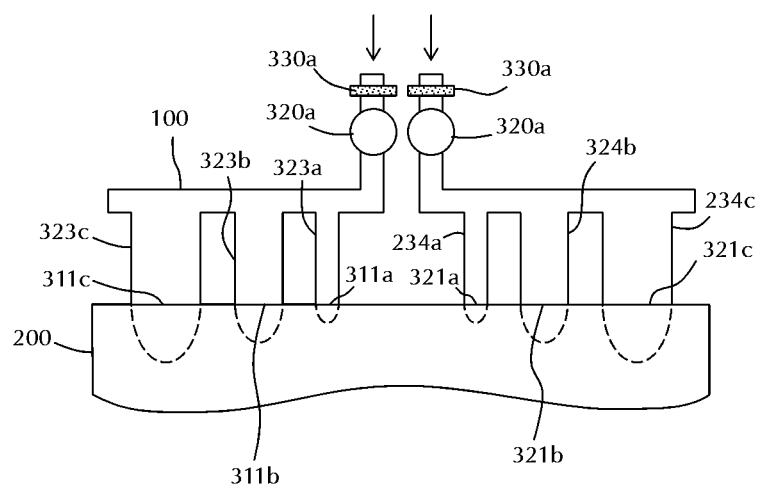
FIG. 16A
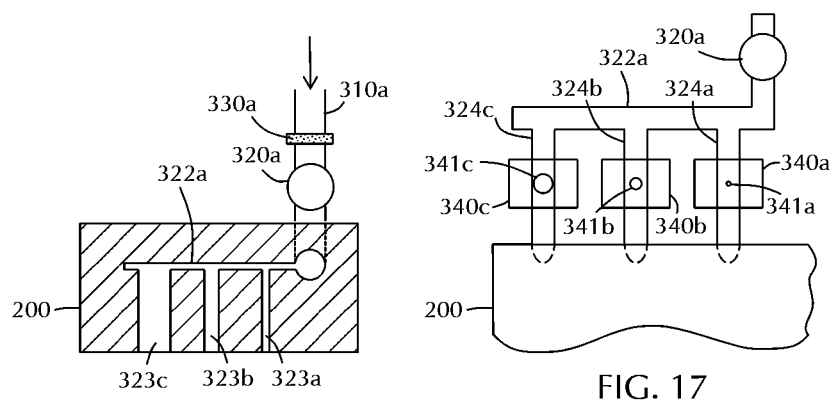
FIG. 16B
FIG. 17

APPARATUS FOR MULTI-FLOW PRECURSOR DOSAGE

CROSS-REFERENCE TO RELATED APPLICATIONS

This application claims priority to U.S. Provisional Application No. 62/731,801, filed Sep. 14, 2018, the entire disclosure of which is hereby incorporated by reference herein.

TECHNICAL FIELD

Embodiments of the disclosure generally relate to an apparatus and methods for flowing a gas into a processing chamber. More specifically, embodiments of the disclosure are directed to linear flow apparatus for directing a flow of gas to a processing chamber such as an atomic layer deposition chamber or chemical vapor deposition chamber.

BACKGROUND

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive, e.g., feature sizes of 0.07 m and aspect ratios of 10 or greater. Accordingly, conformal deposition of materials to form these devices is becoming increasingly important.

During an atomic layer deposition (ALD) process, reactant gases are introduced into a process chamber containing a substrate. Generally, a region of a substrate is contacted with a first reactant which is adsorbed onto the substrate surface. The substrate is then contacted with a second reactant which reacts with the first reactant to form a deposited material. A purge gas may be introduced between the deliveries of each reactant gas to ensure that the only reactions that occur are on the substrate surface.

May CVD and ALD processes show precursor dosage effects due to non-uniformity of precursor flow in the processing chamber. In particular, center to edge uniformity often show patterns related to the configuration of the showerhead apertures. The sizes and spacing the apertures can be changed to increase uniformity. However, modifications of the showerhead can be difficult, expensive and not reversible. Therefore, there is a need in the art for apparatus and methods to deliver a uniform flow of gas to a processing chamber.

SUMMARY

One or more embodiments of the disclosure are directed to gas distribution apparatuses for controlling flow of gas into a process chamber. A spiral gas delivery channel has a length with a plurality of apertures spaced along the length. The spiral gas delivery channel has at least one partition wall separating the gas delivery channel into a plurality of gas delivery zones. Each of the gas delivery zones has a zone length, an inlet and an outlet.

Additional embodiments of the disclosure are directed to gas distribution apparatus comprising a plate having a front side surface and a back side surface. A first gas delivery channel is recessed into the back side surface of the plate. The first gas delivery channel has a spiral shape with a length and is separated along the length by partition walls into a plurality of first zones. Each first zone has an inlet, an outlet and a zone length. A second gas delivery channel is recessed into the back side surface of the plate. The second gas delivery channel has a spiral shape with a length intertwined with the first gas delivery channel. The second gas delivery channel is separated along the length by partition walls into a plurality of second zones. Each second zone has a length, an outlet and zone length. A plurality of first apertures is spaced along the length of the gas delivery channel. Each of the plurality of apertures extends from the front side surface of the plate to the first gas delivery channel. A plurality of second apertures is spaced along the length of the second gas delivery channel. Each of the second apertures extends from the front side surface of the plate to the second gas delivery channel.

Further embodiments of the disclosure are directed to methods of providing a flow of gas to a process region of a processing chamber. A flow of a first gas is provided to a first gas delivery channel in a gas distribution apparatus and a flow of a second gas to a second gas delivery channel in the gas distribution apparatus. The first gas delivery channel and second gas delivery channel are formed in a plate. The first gas delivery channel has a spiral shape with a length and a plurality of apertures spaced along the length. The first gas delivery channel has at least one partition wall separating the first gas delivery channel into a plurality of first zones. Each first zone having a zone length, an inlet and an outlet. The second gas delivery channel has a spiral shape with a length and a plurality of apertures spaced along the length. The second gas delivery channel has at least one partition wall separating the second gas delivery channel into a plurality of second zones. Each second zone has a zone length, an inlet and an outlet.

BRIEF DESCRIPTION OF THE DRAWINGS

So that the manner in which the above recited features of the disclosure are attained and can be understood in detail, a more particular description of the disclosure, briefly summarized above, may be had by reference to the embodiments thereof which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 16A shows a top view of a gas distribution apparatus with manifold in accordance with one or more embodiment of the disclosure;

FIG. 16B shows a schematic cross-sectional view of a manifold in accordance with one or more embodiment of the disclosure; and FIG. 17 shows a schematic view of a gas distribution apparatus with manifold in accordance with one or more embodiment of the disclosure.

DETAILED DESCRIPTION

Embodiments of the disclosure are directed to gas distribution apparatus for use in chemical vapor deposition type processes. One or more embodiments of the disclosure are directed to atomic layer deposition processes and apparatus (also called cyclical deposition) incorporating the gas distribution apparatus described. The gas distribution apparatus described may be referred to as a showerhead or gas distribution plate, but it will be recognized by those skilled in the art that the apparatus does not need to be shaped like a showerhead or plate. The terms "showerhead" and "plate" should not be taken as limiting the scope of the disclosure.

Figure 1:
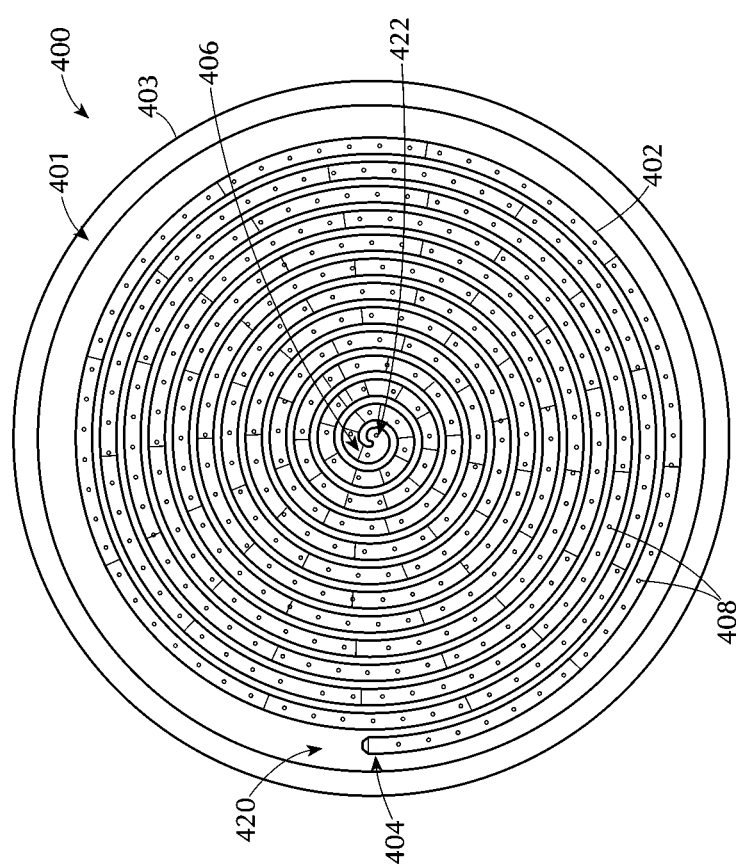
FIG. 1 shows a top view of a gas distribution apparatus in accordance with one or more embodiments of the disclosure.
Figure 2:
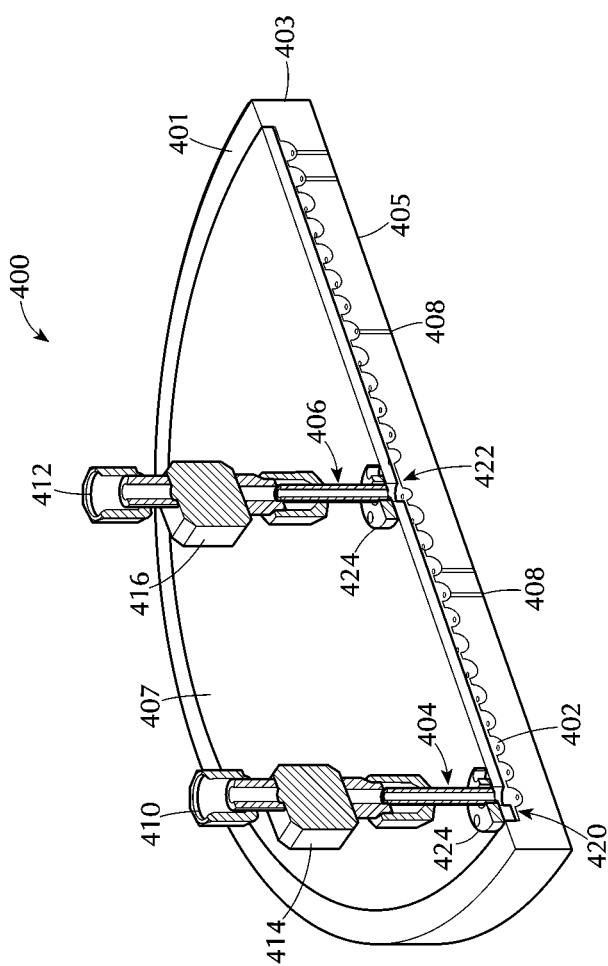
FIG. 2 shows a cross-sectional isometric view of a gas distribution apparatus in accordance with one or more embodiments of the disclosure.

FIGS. 1 through 4 illustrate an embodiment of a gas distribution apparatus 400 having a gas delivery channel 402. In this embodiment, the gas delivery channel 402 is recessed in the back side 401 of the gas distribution plate 403. The embodiment shown has a large inner section recessed into the back side 401 of the gas distribution plate 403 with the delivery channel 402 recessed even further. This allows for the addition of a back cover 407 which can be placed in the recessed area in the back side 401 enclosing the delivery channel 402, as shown in FIG. 2. The back cover 407, when inserted into the recessed back side 401 of certain embodiments creates a substantially flush back side surface of the gas distribution plate. It will be understood by those skilled in the art that the back cover 407 does not need to fit within a recessed area of the back side 401 of the gas distribution plate 403, but can also rest directly on the back side 401 of the gas distribution plate 403. In embodiments of this sort, there is no large recessed area with the delivery channels being further recessed. Instead, the delivery channels are recessed directly into the back side 401 of the gas distribution plate 403.

The back cover 407 may have openings to allow for the passage of inlet and outlet tubes to allow for fluid communication with the delivery channel 402. This can be seen in FIGS. 2 and 3. The inlet and outlet tubes can be an integral part of the back cover 407, or can be separate pieces connected to the back cover 407 in such a manner as to prevent or minimize fluid leakage. A plurality of apertures 408 extend through the gas distribution plate 403 to a front side 405 of the gas distribution plate 403. These apertures can be seen in FIGS. 1, 2 and 4. The plurality of apertures 408 can be evenly spaced along the length of the delivery channel, or can have varied spacing along the length of the channel. Variable spacing may help produce a more uniform gas flow from the delivery channel at points along the delivery channel. For example, in gas delivery channel that has an elaborate shape, the spacing of the apertures can varied along the length.

In the embodiment shown, the gas distribution plate 403 is round and the delivery channel 402 forms a spiral shape. The inlet end 404 is denoted at the outside of the spiral in an outer peripheral region 420 of the gas distribution plate 403 with the outlet end 406 at the center of the spiral in a central region 422 of the gas distribution plate 403. It will be understood by those skilled in the art that the inlet end 404 and outlet end 406 can be reversed with the inlet end 404 being located at the center of the spiral and the outlet end 406 at the outside of the spiral. In some embodiments, one of the inlet end 404 and outlet end 406 is positioned in an outer peripheral region 420 of the gas distribution plate 403 and the other of the inlet end 404 and outlet end 406 is positioned in a central region 422 of the gas distribution plate 403. In one or more embodiments, the inlet end 404 is positioned at the outer peripheral region 420 of the gas distribution plate 403 and the outlet end 406 is positioned at the central region 422 of the gas distribution plate 403. In certain embodiments, the outlet end 406 is positioned at the outer peripheral region 420 of the gas distribution plate 403 and the inlet end 404 is positioned at the central region 422 of the gas distribution plate 403.

Figure 3:
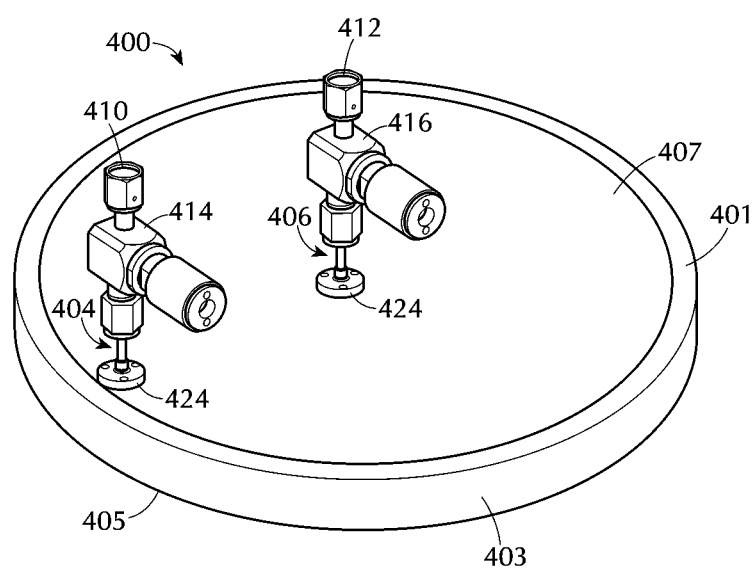
FIG. 3 shows an isometric view of a gas distribution apparatus in accordance with one or more embodiments of the disclosure.
Figure 4:
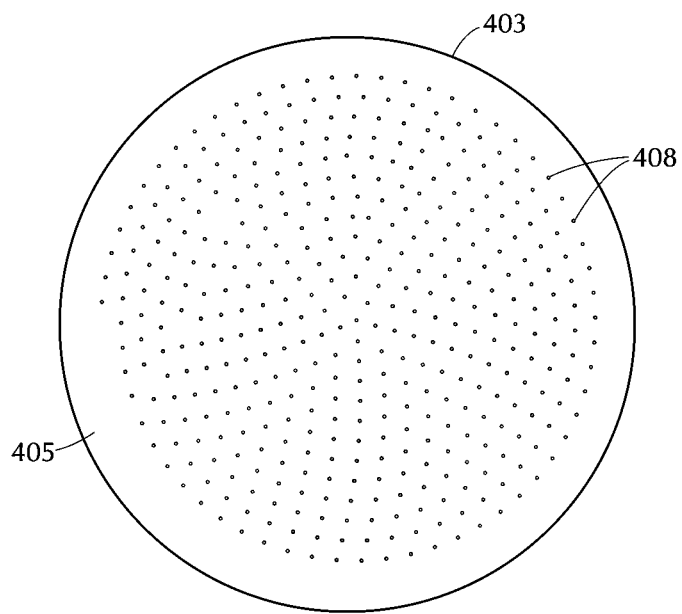
FIG. 4 shows a bottom view of a gas distribution apparatus in accordance with one or more embodiments of the disclosure.

In FIGS. 2 and 3, the inlet end 404 and outlet end 406 are illustrated as a small tube extending from the back cover 407 of the gas distribution plate 403. The tubes extend between the inlet 410 and the back cover 407 through an inlet valve 414. Another tube can extend between the outlet 412 and the back cover 407 through the outlet valve 416. The tubes can be connected to the back cover 407 by any suitable connection known to those skilled in the art and may be sealed to prevent leakage of fluid flowing through the tube into the delivery channel 402. Suitable sealing devices include, but are not limited to, o-rings positioned between a flange 424 and the back cover 407. The flange 424 can be integrally formed with the tube or can be a separate piece that holds the tube to the back cover. The flange 424 can be connected to the back cover 407 by any suitable mechanical connection, including but not limited to, screws.

Figure 5:
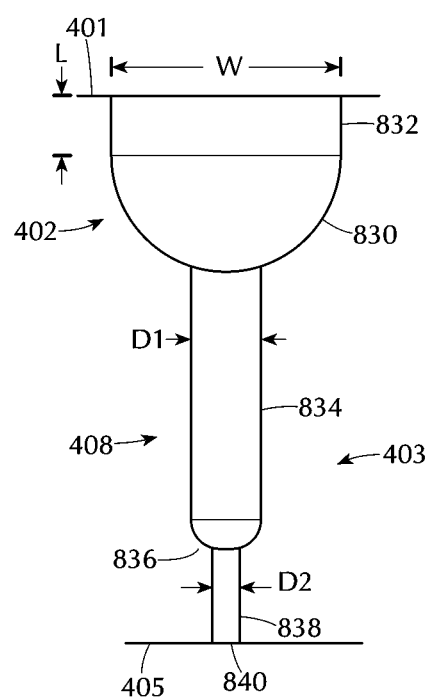
FIG. 5 shows a partial cross-sectional view of a gas distribution apparatus in accordance with one or more embodiments.

FIG. 5 shows a cross-sectional view of one portion of a delivery channel 402 and an aperture 408 in a gas distribution plate 403 in accordance with one or more embodiments of the disclosure. It will be understood by those skilled in the art that the delivery channel and apertures described in FIG. 5 are merely illustrative and should not be taken as limiting the scope of the disclosure. Those skilled in the art will understand that there are other ways of creating flow from the delivery channel 402 through the gas distribution plate 403. The delivery channel 402 shown in FIG. 5 has two portions, an upper portion 832 and a lower portion 830. While these portions are shown as separate areas, it will be understood that there can be a seamless transition between the upper portion 832 and the rounded lower portion 830.

Additionally, it will be understood that the upper portion 832 is optional and does not need to be included in the delivery channel 402. When there is no upper portion 832, the lower portion 830 is the only portion. Thus, the delivery channel can have any suitable shape. In some embodiments, the shape of the delivery channel is such that there is substantially no interference with the flow of gases through the channel.

The upper portion 832 can have any suitable shape. In the embodiment shown in FIG. 5, the upper portion 832 has walls which extend normal to the surface of the back side 401 of the gas distribution plate 403. However, it will be understood that the upper portion 832 can have walls which are canted from square to the back side 401. The canting can provide a larger opening at the back side 401 of the gas distribution plate 403, tapering to a smaller opening. Additionally, the canting can provide a smaller opening at the back side 401, tapering to a larger opening. The length of the upper portion 832 can be modified as necessary.

In some embodiments, the upper portion has sides which are substantially perpendicular to the back side 401 of the gas distribution plate 403 and extend a length L below the surface of the back side 401 in the range of about 0.01 inch to about 0.3 inches. As used in this specification and the appended claims, the term "substantially perpendicular to" means that walls of the upper portion have an angle relative to the back side of the gas distribution plate in the range of about 85 degrees to about 95 degrees. In some embodiments, the upper portion extends below the surface of the back side to a length L in the range of about 0.02 inches to about 0.2 inches, or in the range of about 0.05 inches to about 0.15 inches, or in the range of about 0.08 inches to about 0.12 inches. In one or more embodiments, the upper portion extends below the surface of the back side to a length about 0.1 inches.

The rounded lower portion 830 can have any suitable cross-section including, but not limited to, half-round and half-elliptical. The width of the rounded lower portion, also referred to as the diameter of the rounded lower portion, can be modified as necessary. The width of the upper portion can be modified as necessary. The diameter of the delivery channel, in general, can have an impact of the number of loops in the spiral. In some embodiments, as shown in FIG. 5, the width of the upper portion is about equal to the diameter of the lower portion. The delivery channel of various embodiments has a diameter in the range of about 0.3 inches (~7.5 mm) to about 0.45 inches (~11.5 mm), or in the range of about 0.325 inches (~8.25 mm) to about 0.425 inches (~11 mm), or in the range of about 0.35 inches (~9 mm) to about 0.40 inches (~10 mm). In one or more embodiments, the delivery channel has a diameter of about 0.375 inches (~9.5 mm).

The specific shape of the apertures 408 can vary depending on the desired flow of gases through the apertures. In the embodiment of FIG. 5, the aperture 408 has three distinct sections; a first section 834, a second section 836 and a third section 838. Again, the number of sections and the shape of the sections are merely illustrative of one embodiment and should not be taken as limiting the scope of the disclosure. The first section 834 extends from the rounded lower portion 830 of the delivery channel 402 toward the front side 405 of the gas distribution plate 403. The first section 834 has a first diameter D1. The second section 836 extends from the first section 834 toward the front side 405 and has a diameter which tapers from the first diameter D1 to a second diameter D2, which is generally smaller than the first diameter. The third section 838 extends from the end of the second section 836 and ends at the front side 405 of the gas distribution plate 403. At the intersection of the third section 838 and the front side 405, a hole 840 is formed. Gases flowing through the delivery channel 402 exit the gas distribution plate 403 through this hole 840 into the processing chamber. The hole 840 has about the same diameter as the second diameter D2. In various embodiments, the diameter of the hole 840 is in the range of about 0.01 inches to about 0.25 inches, or in the range of about 0.02 inches to about 0.2 inches, or in the range of about 0.03 inches to about 0.15 inches or in the range of about 0.04 inches to about 0.1 inches. In some embodiments, the hold 840 has a diameter less than about 0.1 inches, or less than about 0.08 inches, or less than about 0.06 inches, or less than about 0.04 inches, or less than about 0.02 inches, or less than about 0.01 inch.

As the delivery channel spirals from the outer peripheral edge of the gas distribution plate to the central region, or vice versa, a seeming plurality of adjacent channels are observable in cross-section, even though it may be a single channel. FIG. 2 shows this seeming plurality of channels. The channels, or separation between loops of the spiral, are separated by a distance. In some embodiments, the distance between the channels, or the loops of the single channel, measured from centers, are in the range of about 0.375 inches to about 0.475 inches, or in the range of about 0.40 inches to about 0.45 inches, or in the range of about 0.41 inches to about 0.43 inches. In one or more embodiments, the average distance between centers of the adjacent channels is about 0.42 inches.

The length of the gas channel shown in FIGS. 1-4 can vary depending on a number of factors, including, but not limited to, the diameter of the channel and the distance between the adjacent channels. In various embodiments, the delivery channel has a length in the range of about 140 inches to about 340 inches, or in the range of about 180 inches to about 300 inches, or in the range of about 200 inches to about 280 inches, or in the range of about 220 inches to about 260 inches. In one or more embodiments, the delivery channel has a length of about 240 inches.

The number of apertures is also dependent on a number of factors, including but not limited to, the length of the delivery channel and the spacing of the apertures. In some embodiments having a single spiral channel, there are in the range of about 300 and 900 apertures, or in the range of about 400 to about 800 apertures, or in the range of about 500 to about 700 apertures. In various embodiments, there are greater than about 300, 400, 500, 600, 700 or 800 apertures along the length of the channel. In one or more embodiments, there are about 600 apertures along the length of the delivery channel.

In an embodiment, as shown in FIG. 1, the gas delivery plate 403 comprises a single delivery channel 402 in a back side of the gas delivery plate 403. The delivery channel 402 has an inlet end 404 located in an outer peripheral region 420 of the gas distribution plate 403. The delivery channel 402 and follows an inward spiral path from the inlet end 404 to an outlet end 406 located in a central region 422 of the gas distribution plate 403. The delivery channel 402 has an overall length, defined as the distance between the inlet end 404 and the outlet end 406 of about 240 inches. A plurality of apertures 408 are spaced along the overall length of the delivery channel 402. Along the overall length of the delivery channel 403 there are in the range of about 500 apertures and about 700 apertures. The delivery channel 403 has an average diameter of about 0.375 inches and adjacent portions of the spiral channel are spaced about 0.42 inches on center.

Another embodiment of the disclosure is shown in FIGS. 6 through 10. A gas distribution apparatus 900 comprises two delivery channels 902a, 902b recessed in the back side 901 of a gas distribution plate 903. The first delivery channel 902a has a first inlet end 904a and a first outlet end 906a and a plurality of first apertures 908a spaced along the length of the first delivery channel 902a. The second delivery channel 902b has a second inlet end 904b, a second outlet end 906b and a plurality of second apertures 908b spaced along the length of the second delivery channel 902b.

A first inlet 910a is connected to the first inlet end 904a of the first delivery channel 902a. The first inlet 910a is adapted to be connected to a gas source. A first outlet 912a is connected to the first outlet end 906a of the first delivery channel 902a. The first outlet 912a is adapted to be connected to a vacuum source. A second inlet 910b is connected to the second inlet end 904b of the second delivery channel 902b. The second inlet 910b is adapted to be connected to a gas source. A second outlet 912b is connected to the second outlet end 906b of the second delivery channel 902b. The second outlet 912a is adapted to be connected to a vacuum source.

In the embodiment shown in FIGS. 6 to 10, each of the delivery channels 902a, 902b form a spiral shape. One or more embodiments, as that shown in the Figures, have the two delivery channels 902a, 902b intertwined along the length of the spiral shape. It will be understood by those skilled in the art that the two delivery channels 902a, 902b can have shapes other than spiral and do not need to intertwine. In certain embodiments, the plurality of first apertures 908a and second apertures 908b extend through the gas distribution plate 903 to the front side 905 of the gas distribution plate 903.

In some embodiments, each of the delivery channels 902a, 902b form a spiral shape with one of the inlet end 904a, 904b and outlet end 906a, 906b positioned in an outer peripheral region 920 of the gas distribution plate 903 and the other of the inlet end 904a, 904b and outlet end 906a, 906b positioned in a central region 922 of the gas distribution plate 903. In one or more embodiments, the inlet ends 904a, 904b of both channels 902a, 902b is positioned in the outer peripheral region 920 and the inlet ends 904a, 904b of both channels 902a, 902b are positioned in the central region 922 of the gas distribution plate 903. In certain embodiments, the inlet ends 904a, 904b of both channels 902a, 902b is positioned in the central region 922 and the inlet ends 904a, 904b of both channels 902a, 902b are positioned in the outer peripheral region 920 of the gas distribution plate 903. In one or more embodiments, one or the inlet ends 904a, 904b is positioned in the outer peripheral region 920 and the other inlet end 904b, 904a is positioned at the central region 922, with the outlet ends 906a, 906b at the other end of each individual delivery channel 902a, 902b.

Figure 6:
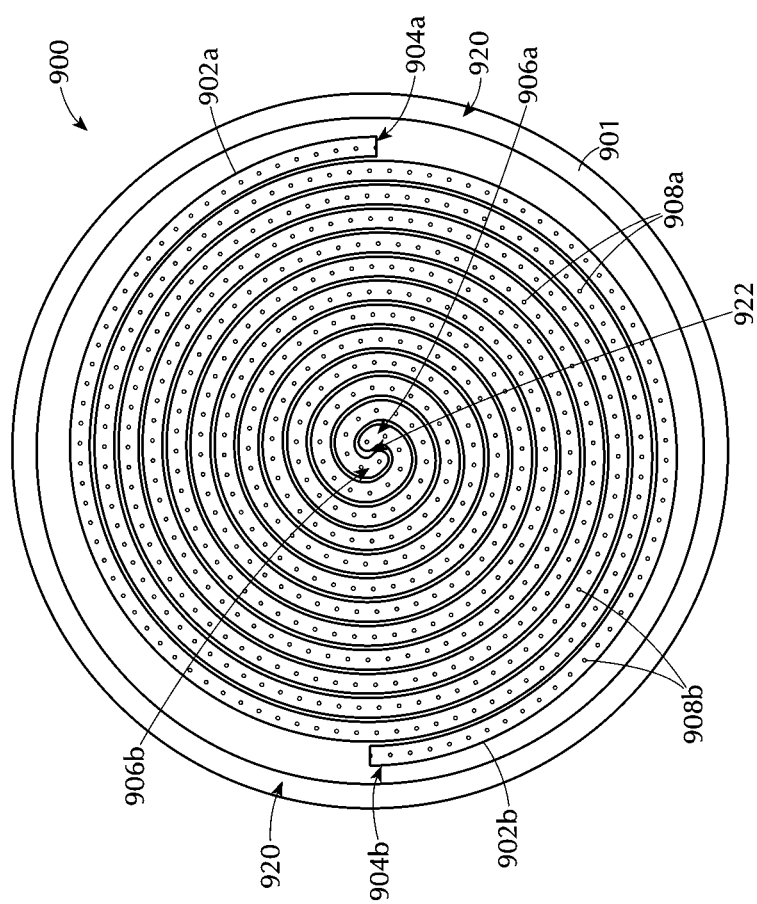
FIG. 6 shows a top view of a gas distribution apparatus in accordance with one or more embodiments of the disclosure.
Figure 7:
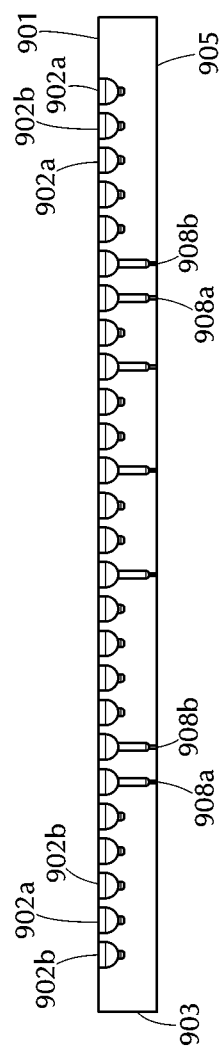
FIG. 7 shows a partial cross-sectional view of a gas distribution apparatus in accordance with one or more embodiments of the disclosure.
Figure 8:
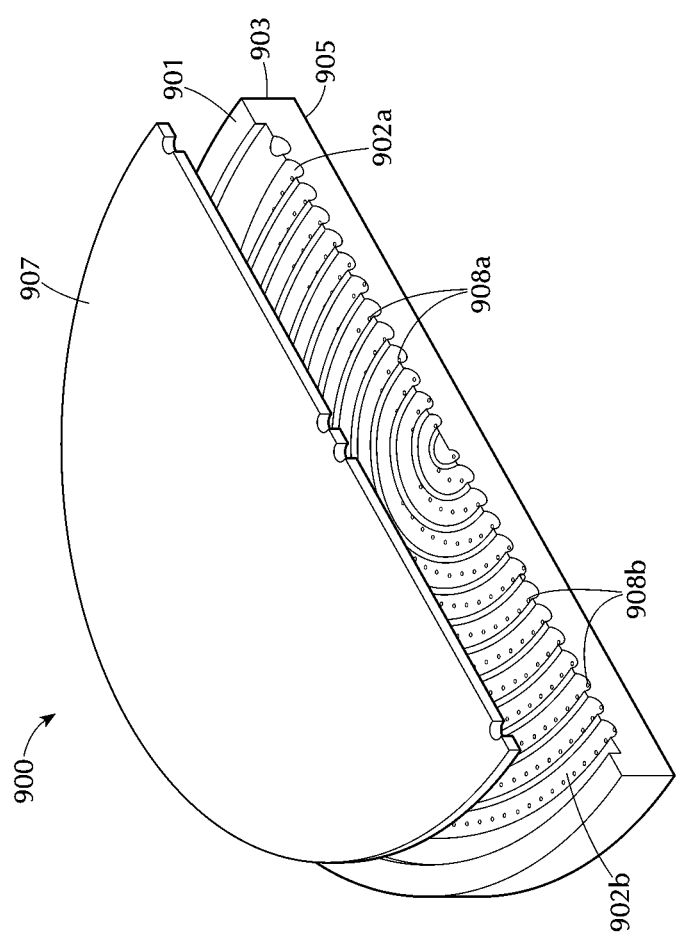
FIG. 8 shows a view of an exploded partial cross-sectional view of a gas distribution apparatus in accordance with one or more embodiments of the disclosure.
Figure 9:
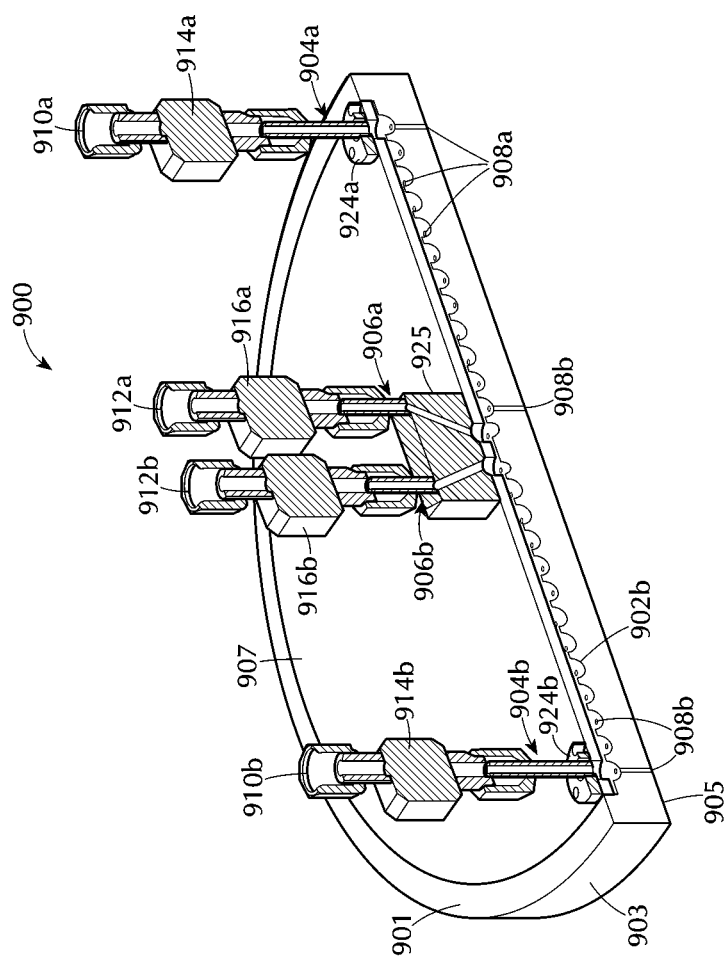
FIG. 9 shows a cross-section of an isometric view of a gas distribution apparatus in accordance with one or more embodiments of the disclosure.
Figure 10:
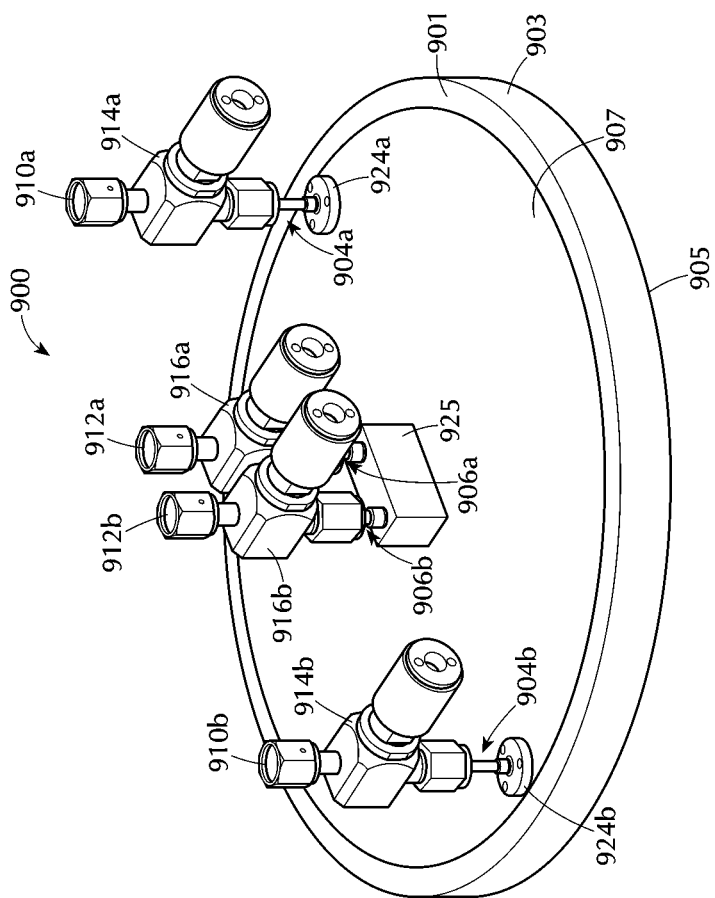
FIG. 10 shows an isometric view of a gas distribution apparatus in accordance with one or more embodiments of the disclosure.

FIG. 8 shows a back cover 907 for the gas distribution plate 903 shown in FIG. 6. There are four holes (not numbered) located in the back cover 907 which align approximately with the inlet ends 904a, 904b and outlet ends 906a, 906b of the delivery channels 902a, 902b. The holes can be used to provide an access point for connected in the inlet 910a, 910b and outlet 912a, 912b to the channels 902a, 902b. In some embodiments, there inlet 910a, 910b and outlet 912a, 912b are integrally formed with the back cover 907. Additionally, as seen in FIGS. 9 and 10, there can be one or more inlet valves 914a, 914b and outlet valves 916a, 916b FIGS. 9 and 10 show perspective views of a gas distribution apparatus 900 in accordance with various embodiments of the disclosure. The inlets 910a, 910b are shown connected to the back cover 907 with a flange 924a, 924b. The connection and gas-tight sealing of the flange 924a, 924b can be accomplished by any suitable mechanism and techniques as known to those skilled in the art. The outlets 912a, 912b can also be connected to the back cover 907 with a flange or with a block connection 925. The block 925 can be integrally formed with the back cover 907 or can be a separate piece. The block 925 may provide additional support and space for the outlet valves 916a, 916b, allowing the connecting tubes to protrude from the back cover 907 at an angle. Although the inlets 910a, 910b and inlet valves 914a, 914b are shown on the outside peripheral region 920 of the gas distribution plate 903 and the outlets 912a, 912b and outlet valves 916a, 916b are shown at the central region 922 of the gas distribution plate 903, it will be understood that these components can be reversed or intermixed and that the drawings are merely illustrative of one embodiment.

As the delivery channels spiral from the outer peripheral edge of the gas distribution plate to the central region, or vice versa, a seeming plurality of adjacent channels are observable in cross-section. With the spirals intertwined, the gas in every adjacent channel is from the other inlet 910a, 910b. The channels are separated by a distance from the adjacent channels. In some embodiments, the distance between the channels, measured from the center of the channel, are in the range of about 0.375 inches to about 0.475 inches, or in the range of about 0.40 inches to about 0.45 inches, or in the range of about 0.41 inches to about 0.43 inches. In one or more embodiments, the average distance between centers of the adjacent channels is about 0.42 inches.

The length of the gas channel shown in FIGS. 6-10 can vary depending on a number of factors, including, but not limited to, the diameter of the channel and the distance between the adjacent channels. In various embodiments, each of the delivery channels has a length in the range of about 70 inches to about 170 inches, or in the range of about 90 inches to about 150 inches, or in the range of about 100 inches to about 140 inches, or in the range of about 110 inches to about 130 inches. In one or more embodiments, the delivery channel has a length of about 120 inches.

The number of apertures is also dependent on a number of factors, including but not limited to, the length of the delivery channel and the spacing of the apertures. In some embodiments having a single spiral channel, there are in the range of about 150 and 450 apertures, or in the range of about 200 to about 400 apertures, or in the range of about 250 to about 350 apertures. In various embodiments, there are greater than about 150, 200, 250, 300, 350 or 400 apertures along the length of the channel. In one or more embodiments, there are about 300 apertures along the length of each of the delivery channels.

Many CVD/ALD processes show precursor dosage effects on metal deposition uniformity on wafer from center to edge of the wafer. Variable hole sizes along the length of the gas delivery channel or in a showerhead can be changed to improve uniformity of the deposition process. Some embodiments of the disclosure provide spiral gas distribution apparatus with improved center to edge non-uniformity. Some embodiments incorporate different gas delivery zones with different amounts of precursor flow to improve uniformity. In some embodiments, the amount of precursor flow is controlled using orifices of varying dimensions within the flow path to the various zones.

In some embodiments, a spiral showerhead is provided with different zones for precursor flow into the chamber. The showerhead can be designed with N number of zones (e.g., N=3) for multiple precursors for CVD/ALD processes. For each precursor, flow in each zone can be controlled by individual valves (e.g., PLC valves) and dosage of precursor can be controlled by individual orifice with variable sizes. N number of valves can be synchronized to operate "open & close" during sequential precursor exposure to the wafer.

Some embodiments provide a gas line manifold to provide gas flow to the different zones. The manifold of some embodiments includes integrated purge for purging and maintaining positive pressure at the upstream side of the chamber. The manifold can be configured to flow precursor in N number of zones through the showerhead and use a single dumpline for each precursor (e.g., two dumplines for two precursors). In some embodiments, a needle valve is used instead of the orifice to increase process tunability. In some embodiments, a needle valve and an orifice are used together to control the process. Some embodiments of the disclosure provide apparatus to maintain multiple gas flows based on process requirements. Some embodiments provide apparatus with improved equilibrium flow times, i.e., changes in gas flow reach the wafer surface faster than by conventional gas distribution apparatus.

Figure 11:
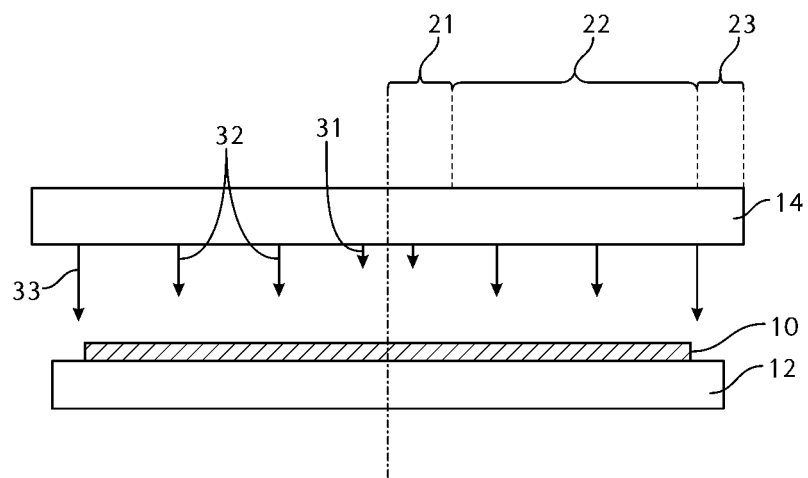
FIG. 11 shows a schematic representation of a multi-zone gas flow into a processing chamber.

FIG. 11 provides a schematic representation of a flow pattern in accordance with one or more embodiment. A substrate 10 is positioned on a substrate support 12 so that the substrate is spaced a distance from the showerhead 14. The illustrated flow pattern has three zones: an inner zone 21, a middle zone 22 and an outer zone 23. The inner zone 21 is positioned at the center of the wafer and the outer zone 23 is positioned at the outer periphery of the wafer. The amount of precursor 31 flowing in the inner zone 21 is less than the amount of precursor 32 flowing in the middle zone 22 which is less than the amount of precursor 33 flowing in the outer zone 23 (indicated by arrows of varying lengths). The illustrated embodiment is merely one possible configuration and should not be taken as limiting the scope of the disclosure. The number of zones, relative precursor amounts and/or flow rates, for example, can be changed to improve uniformity.

Figure 12:
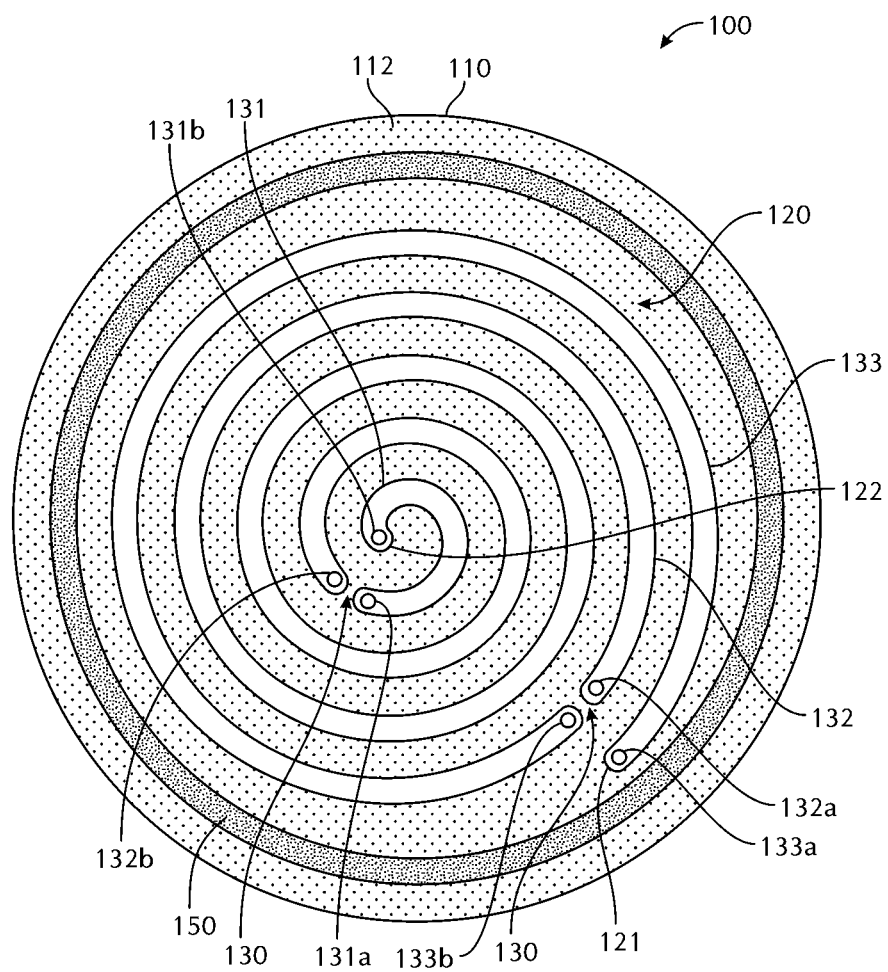
FIG. 12 shows a top view of a gas distribution apparatus in accordance with one or more embodiment of the disclosure.

FIG. 12 illustrates a gas distribution apparatus 100 in accordance with one or more embodiment of the disclosure. The gas distribution apparatus 100 includes a plate 110 with a back side surface 112 and a front side surface (not visible). A gas delivery channel 120 is on the back side surface 112 of the plate 110. In some embodiments, the delivery channel 120 is recessed into the back side surface 112 of the plate 110, as illustrated in FIG. 2.

The gas delivery channel 120 is illustrated as a spiral channel. This is merely representative of one possible configuration. In some embodiments, the gas delivery channel 120 is an irregular shape.

The spiral gas delivery channel 120 has a total length defined by the outermost point 121 of the spiral along the channel 120 to the innermost point 122. A plurality of apertures is spaced along the length of the gas delivery channel 120. The apertures can be seen in the embodiments of FIGS. 1 through 10 and are omitted from FIGS. 12 and 13 for clarity.

The spiral gas delivery channel 120 has at least one partition wall 130 along the length of the channel 120. The partition wall 130 separates the channel 120 into a plurality of zones. In the illustrated embodiment, there are two partition walls 130 separating the channel 120 into three zones: an inner zone 131, a middle zone 132 and an outer zone 133. Each of the gas delivery zones has a zone length measured from the innermost and outermost points of the zone along the length of the spiral gas delivery channel 120. Each of the gas delivery zones 131, 132, 133 has an inlet 131a, 132a, 133a and an outlet 131b, 132b, 133b. The inlets and outlets are illustrated as circles on the Figures to represent which end of the zone length is discussed. Inlet and outlet openings can be in the back cover aligned with the marks indicated on the Figures.

In the illustrated embodiments, the inlets 131a, 132a, 133a of each of the zones are shown at the outer end (further from the center) of the spiral and the outlets 131b, 132b, 133b are shown at the inner end (closer to the center) of the spiral. However, the inlets and outlets can be reversed so that the inlets are closer to the inner end and the outlets are closer to the outer end of the spiral. In some embodiments, some of the inlets are at the inner end of the zones and at least one of the outlets is at the inner end of at least one zone.

The Figures illustrate embodiments in which three zones are formed by the partitions. However, there can be more or less than three zones. In some embodiments, there are two zones. In some embodiments, there are four, five, six or more zones.

Figure 13:
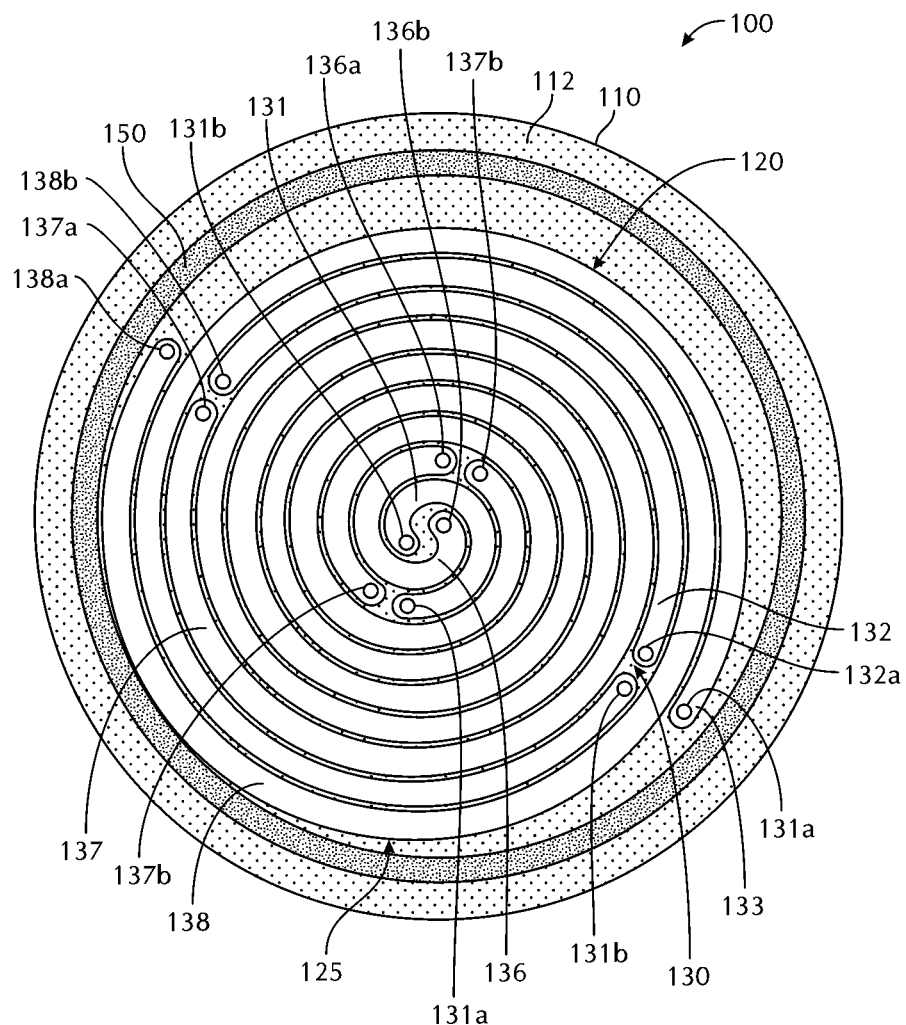
FIG. 13 shows a top view of a gas distribution apparatus in accordance with one or more embodiment of the disclosure.

FIG. 13 illustrates another embodiment of the disclosure in which there are two delivery channels: a first delivery channel 120 and a second delivery channel 125. Each of the first delivery channel 120 and the second delivery channel 125 are recessed in the back side 112 of the plate 110. In the illustrated embodiment each of the delivery channels 120, 125 form spiral shapes that are intertwined. Partitions 130 separate each of the channels 120, 125 into three zones. The first delivery channel 120 is separated into an inner zone 131, a middle zone 132 and an outer zone 133 and the second delivery channel 125 is separated into an inner zone 136, middle zone 137 and outer zone 138.

The inlets 131a, 132a, 133a, 136a, 137a, 138a of some embodiments, as shown in FIG. 13, are positioned at the outer end of the zones and each of the outlets 131b, 132b, 133b, 136b, 137b, 138b are positioned at the inner end of the zones. In some embodiments, each of the inlets is at the inner end of the zones and each of the outlets is at the outer end of the zones. In some embodiments, each of the inlets for the zones of the first delivery channel 120 are positioned at the inner end of the zones and each of the inlets for the zones of the second delivery channel 125 are positioned at the outer end of the zones.

Figure 14:
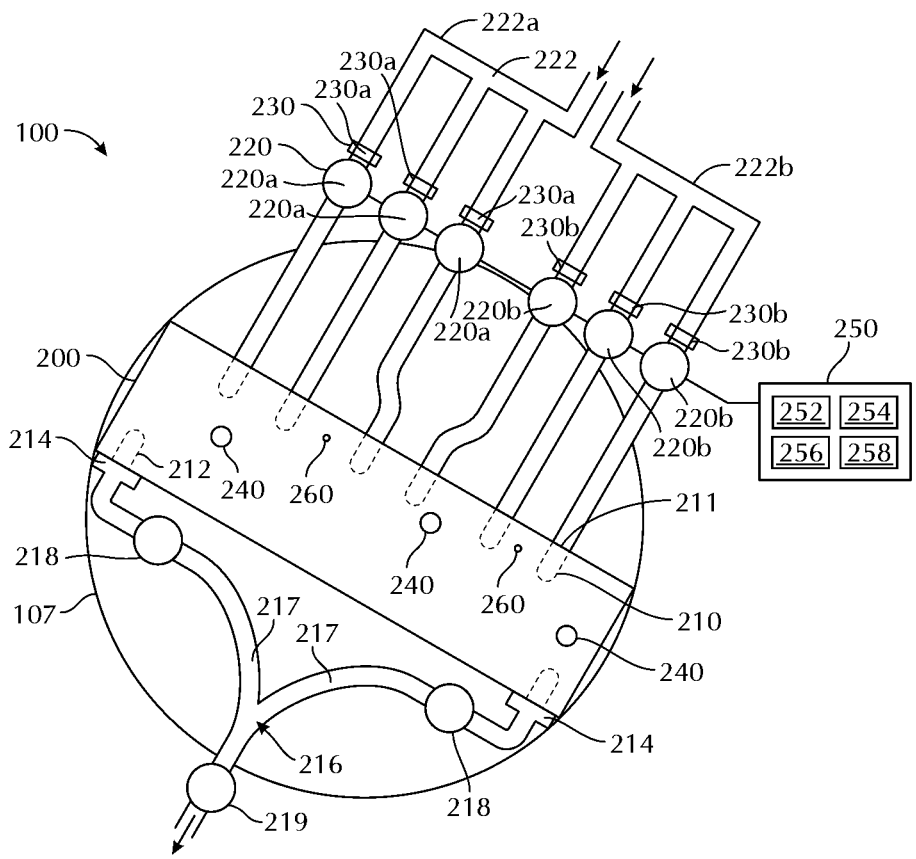
FIG. 14 shows a top view of a gas distribution apparatus with manifold in accordance with one or more embodiment of the disclosure.

FIG. 14 shows a top schematic view of a gas distribution apparatus 100 of some embodiments. A back cover 107 is sized to cover the plate and enclose the gas delivery channels, as shown in FIG. 1. A gas distribution manifold 200 is on the back cover 107. The gas distribution manifold 200 has a plurality of inlet passages 210 (shown in dotted lines) and a plurality of outlet passages 212 (shown in dotted lines). The inlet passages 210 provide fluid communication between the zone inlets and a gas source (not shown) and the outlet passage 212 provide fluid communication between the zone outlets and exhaust (not shown).

Figure 15:
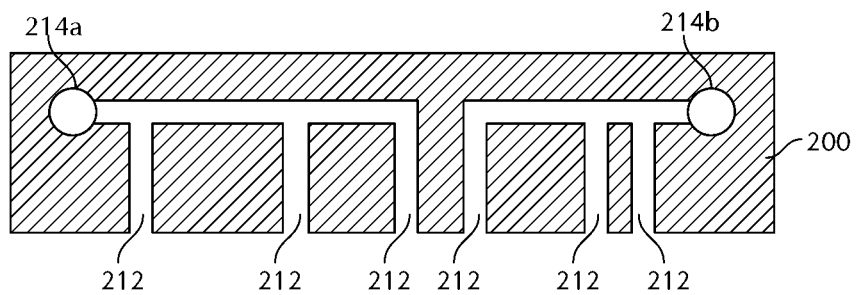
FIG. 15 shows a cross-sectional view of a manifold in accordance with one or more embodiment of the disclosure.

FIG. 15 shows a cross-sectional view of the manifold 200 showing the internal outlet passages 212. In some embodiments, the zone outlets for the first delivery channel are in fluid communication to exhaust through a plurality of outlet passages in the manifold that merge to a first exhaust opening 214a. The six outlet passages 212 illustrated in FIG. 15 are in fluid communication with one of the six zones shown in FIG. 14. In some embodiments, the zone outlets for the second delivery channel are in fluid communication to exhaust through a plurality of outlet passages 212 in the manifold 200 that merge to a second exhaust opening 214*b*.

Referring again to FIG. 14, in some embodiments each manifold inlet opening 211 is in fluid communication with a valve 220 and optional orifice 230. In some embodiments, there are no orifices 230. In some embodiments, there are fewer orifices 230 than valves 220. In some embodiments, each valve 220 has an orifice 230. In use, the orifices 230 can be different so that the amount of precursor flowing through conduits 222 to valves 220 can be controlled. A smaller sized orifice 230 can be used to restrict the amount of precursor and a larger sized orifice 230 can be used to increase the amount of precursor flowing into the manifold 200.

The manifold 200 of some embodiments includes a purge inlet 240 that can be connected to a purge gas source. The purge inlet can be used to flow a purge gas into the processing chamber through channel 150 (see FIGS. 12 and 13). In some embodiments, the purge inlet can be used to provide positive pressure upstream of the chamber when no precursor is flowing through valves 220.

In some embodiments, each of the valves 220 is in communication with a controller 250. The controller 250 of some embodiments is configured to open all of the valves 220 in fluid communication with one of the delivery channels at the same time. For example, all of the valves providing flow to the first gas delivery channel can be opened at the same time and all of the valves providing flow to the second gas delivery channel can be closed. The valve states can be reversed so that the second gas delivery channel is active and the first gas delivery channel is inactive. By flowing only one of the precursors at a time an atomic layer deposition process can be performed. In some embodiments, both gas delivery channels are active at the same time to provide a chemical vapor deposition type process. In some embodiments, one or more valves are in fluid communication with the exhaust lines 217. For example, in the embodiment shown in FIG. 14, the exhaust lines 217 merge into a single exhaust line at merge point 216 and have optional valves 218 upstream of the merge point 216 and optional valve 219 downstream of the merge point 216. In some embodiments, the exhaust line has one or more valves 218 upstream of the merge point 216. In some embodiments, the exhaust line has one or more valves 218 upstream of the merge point 216 and no valves downstream of the merge point 216. In some embodiments, the exhaust line has a valve 219 downstream of the merge point 216. In some embodiments, the exhaust line has a valve 219 downstream of the merge point 216 and no valves upstream of the merge point 216.

The embodiment illustrated in FIG. 14 has two separate conduits 222*a*, 222*b*. In some embodiments, the two conduits 222*a*, 222*b* are connected upstream of the illustration to provide a single gas flow to both conduit 222*a* and conduit 222*b*. In some embodiments, conduit 222*a* and conduit 222*b* are connected to and in fluid communication with separate gas sources (not shown). Conduit 222*a* is connected to manifold 200 through orifices 230*a* and valves 220*a*, and conduit 222*b* is connected to manifold 200 through orifices 230*b* and valves 220*b*.

FIG. 16A shows another embodiment of the manifold 200 in which two conduits 322*a*, 322*b* are connected to the manifold through different sized inlet lines. In the illustrated embodiment, the gas flows into conduit 322*a* through valve 320*a* and orifice 330*a*. The gas flow in conduit 322*a* splits into three inlet lines 323*a*, 323*b*, 323*c* with each inlet line 323*a*, 323*b*, 323*c* connected to inlet openings 311*a*, 311*b*, 311*c*, respectively. A gas flows into conduit 322*b* through valve 320*b* and orifice 330*b*. The gas flow in conduit 322*b* splits into three inlet lines 324*a*, 324*b*, 324*c* with each inlet line 324*a*, 324*b*, 324*c* connected to inlet opening 321*a*, 321*b*, 321*c*, respectively. The sizes of the inlet lines are different so that the gas flow conductance entering openings or the gas flow in gas delivery zones is controlled. The conductance can be changed by changing the sizes of the inlet lines so that the conductance at the different delivery zones can be modified. In some embodiments, the conductances at the different delivery zones are about the same (e.g., within 5% relative). In some embodiments, the conductances at each of the delivery zones are different. The sizes of the inlet lines can be changed by changing one or more of the length or diameter of the inlet lines. FIG. 16B shows a portion of the manifold 200 of a similar embodiment to FIG. 16A in which the conduits 322*a*, 322*b* are within the manifold 200 and a single source line 310*a* connects to the conduit 322*a*. In the illustrated embodiments, inlet lines 323*a*, 323*b*, 323*c* connect to conduit 322*a* within the manifold 200. The illustrated embodiment includes the left side of the embodiment illustrated in FIG. 16A. The right side is a mirror image of the left side shown.

FIG. 17 shows another embodiment of the manifold 200 in which the gas flow conductance entering the openings 311*a*, 311*b*, 311*c*, or in the gas delivery zones is controlled by different size orifice 340*a*, 340*b*, 340*c* openings 341*a*, 341*b*, 341*c*, respectively. The sizes of the openings 341*a*, 341*b*, 341*c* can be changed so that the conductance at the different delivery zones can be modified. In some embodiments, the conductances at the different delivery zones are about the same (e.g., within 5% relative). In some embodiments, the conductances at each of the delivery zones are different. In some embodiments, the opening 341*a* of orifice 340*a* closest to source line 310*a* are smaller than the openings 341*c* of orifice 340*c* further from the source line 310*a*.

In some embodiments, as shown in FIG. 14, the manifold 200 includes one or more auxiliary openings 260. The auxiliary openings 260 can pass through the entire manifold 200 or can be partial openings. In some embodiments, the auxiliary openings 260 are used as a holder for a thermal probe to measure temperature of the manifold, gases and/or substrate. For example, a plurality of pyrometers can be inserted to measure the substrate temperature through the manifold.

In some embodiments, at least one controller 250 is connected to the individual valves 220 to control a flow of gas through the gas distribution apparatus 100. The controller 250 may be one of any form of general-purpose computer processor, microcontroller, microprocessor, etc., that can be used in an industrial setting for controlling various chambers and sub-processors.

In some embodiments, the at least one controller 250 has a processor 252, a memory 254 coupled to the processor 252, input/output devices 256 coupled to the processor 252, and support circuits 258 to communication between the different electronic and mechanical components. The memory 254 can include one or more of transitory memory (e.g., random access memory) and non-transitory memory (e.g., storage).

The memory 254, or computer-readable medium, of the processor may be one or more of readily available memory such as random access memory (RAM), read-only memory (ROM), floppy disk, hard disk, or any other form of digital storage, local or remote. The memory 254 can retain an instruction set that is operable by the processor 252 to control parameters and components of the system. The support circuits 258 are coupled to the processor 252 to support the processor in a conventional manner. Circuits may include, for example, cache, power supplies, clock circuits, input/output circuitry, subsystems, and the like.

Processes may generally be stored in the memory as a software routine that, when executed by the processor, causes the apparatus to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 250 has one or more configurations to execute individual processes or sub-processes to perform embodiments of the methods. The controller 250 can be connected to and configured to operate intermediate components to perform the functions of the methods. For example, the controller 250 can be connected to and configured to control one or more of gas valves, actuators, motors, slit valves, vacuum control, etc.

The controller 250 of some embodiments has one or more configurations selected from: a configuration to control the one or more valves 220 to open and/or close the valve; a configuration to control one or more exhaust valves 218, 219; a configuration to control a flow of gas into purge inlet 240; or a configuration to read information provided by one or more thermal sensors.

Some embodiments of the disclosure are directed to methods of providing a flow of gas to a process region of a processing chamber. A flow of a first gas is provided to a first gas delivery channel in a gas distribution apparatus and a flow of a second gas is provided to a second gas delivery channel in the gas distribution apparatus. The first gas and second gas flows can be sequential or simultaneous.

The first gas flows to the processing chamber through a plurality of first inlet lines to a gas manifold. Each of the first inlet lines has a valve and, optionally, an orifice. The valves can be opened to allow flow of the first gas into the processing chamber. The size of the orifices can be changed to change the amount of first gas passing into the gas manifold through the valves to change the precursor amounts in the different zones.

The second gas flows to the processing chamber through a plurality of second inlet lines to the gas manifold. Each of the second inlet lines has a valve and, optionally, an orifice. The valves can be opened to allow a flow of the second gas into the processing chamber. The size of the orifices can be changed to change the amount of second gas passing into the gas manifold through the valves to change the precursor amount in the different zones.

The apparatus can be used for plasma processing. For example, the delivery channel, gas distribution apparatus or showerhead can be polarized relative to another portion of the processing chamber to ignite a plasma within the chamber. The delivery channel, gas distribution apparatus or showerhead can be polarized relative to a portion of the chamber, or a portion of the chamber can be biased relative to the delivery channel, gas distribution apparatus or showerhead. For example, the delivery channel, gas distribution apparatus or showerhead can be polarized relative to the pedestal, or the pedestal can be polarized relative to the delivery channel, gas distribution apparatus or showerhead. The frequency of the plasma can be tuned as well. In one or more embodiments, the plasma is at a frequency of about 13.56 MHz. In some embodiments, the plasma is at a frequency of about 40 MHz, 50 MHz, 60 MHz, 70 MHz, 80 MHz, 90 MHz, 100 MHz, 110 MHz or 120 MHz.

In some embodiments, there is an insulating material (not shown) positioned between the back cover and the main body portion of the gas distribution apparatus (i.e., the portion including the gas delivery channel). This insulating material provides electrical isolation between the back cover and the main body portion of the gas distribution apparatus so that the back cover can be polarized relative to the main body portion. Doing so may allow for the ignition of a plasma within the gas distribution apparatus, or within the delivery channels. The plasma can then be flowed through the plurality of apertures into the processing region of the processing chamber, the processing region being the region between the gas distribution apparatus and the pedestal. This configuration may be referred to as a remote plasma because the plasma is formed (e.g., ignited) outside of the processing region.

The gas distribution apparatus described can be used to form one or more layers during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). Remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required.

According to one or more embodiments, the gas distribution apparatus can be used to subject a substrate to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

A substrate can be processed in single substrate deposition chambers using, for example, the gas distribution apparatus described. In such chambers, a single substrate is loaded, processed and unloaded before another substrate is processed. A substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A gas distribution apparatus comprising: a spiral gas delivery channel having a length with a plurality of apertures spaced along the length, the spiral gas delivery channel having at least one partition wall separating the gas delivery channel into a plurality of gas delivery zones, each gas delivery zone having a zone length, an inlet and an outlet.

2. The gas distribution apparatus of claim 1, wherein the gas delivery channel is recessed into a back side surface of a plate and the plurality of apertures extend through the plate to a front side surface.

3. The gas distribution apparatus of claim 2, wherein the delivery channel forms a spiral shape and each zone has an inner end and an outer end and one of the inlet and outlet is positioned at the outer end of the zone and the other of the inlet end and outlet end positioned at the inner end of the zone.

4. The gas distribution apparatus of claim 2, wherein there are two delivery channels recessed in the back side of the plate to form a first delivery channel and a second delivery channel.

5. The gas distribution apparatus of claim 4, wherein each of the delivery channels forms a spiral shape and each zone has an inner end and an outer end and one of the inlet and outlet is positioned at the outer end of the zone and the other of the inlet and outlet is positioned at the inner end of the zone.

6. The gas distribution apparatus of claim 5, wherein the two delivery channels are intertwined along the spiral shape.

7. The gas distribution apparatus of claim 6, wherein the inlet of each of the zones is positioned at the inner end or outer end of the zone and the outlet is positioned at the other of the inner end or outer end of the zone.

8. The gas distribution apparatus of claim 6, wherein each of the inlets for the zones of the first delivery channel are positioned at the inner end of the zones and each of the inlets for the zones of the second delivery channel are positioned at the outer end of the zones.

9. The gas distribution apparatus of claim 6, further comprising a back cover on the back side of the plate, the back cover covering the recessed channel.

10. The gas distribution apparatus of claim 9, further comprising a gas distribution manifold on the back cover, the gas distribution manifold having a plurality of inlet passages to provide fluid communication between a gas source and the zone inlets and a plurality of outlet passages to provide fluid communication between the zone outlets and exhaust.

11. The gas distribution apparatus of claim 10, wherein the zone outlets for the first delivery channel are in fluid communication to exhaust through a plurality of outlet passages in the manifold that merge to a first exhaust opening and the zone outlets for the second delivery channel are in fluid communication to exhaust through a plurality of outlet passages in the manifold that merge to a second exhaust opening.

12. The gas distribution apparatus of claim 10, wherein each inlet passage forms a fluid connection between a manifold inlet opening and a zone of one of the delivery channels.

13. The gas distribution apparatus of claim 12, wherein each manifold inlet opening is in fluid communication with a valve.

14. The gas distribution apparatus of claim 13, wherein each of the valves is in communication with a controller, the controller configured to open all of the valves in fluid communication with one of the delivery channels at the same time.

15. A gas distribution apparatus comprising: a plate having a front side surface and a back side surface; a first gas delivery channel recessed into the back side surface of the plate, the first gas delivery channel having a spiral shape with a length, the gas delivery channel separated along the length by partition walls into a plurality of first zones, each first zone having an inlet, an outlet and a zone length; a second gas delivery channel recessed into the back side surface of the plate, the second gas delivery channel having a spiral shape with a length intertwined with the first gas delivery channel, the second gas delivery channel separated along the length by partition walls into a plurality of second zones, each second zone having a length, an outlet and zone length; a plurality of first apertures spaced along the length of the gas delivery channel, each of the plurality of first apertures extend from the front side surface of the plate to the first gas delivery channel; and a plurality of second apertures spaced along the length of the second gas delivery channel, each of the second apertures extend from the front side surface of the plate to the second gas delivery channel.

16. The gas distribution apparatus of claim 15, further comprising a back cover positioned adjacent the back side surface of the plate to enclose the gas delivery channels, the back cover having a plurality of openings to allow fluid communication to the zone inlets and zone outlets through the back cover.

17. A method of providing a flow of gas to a process region of a processing chamber, the method comprising: providing a flow of a first gas to a first gas delivery channel in a gas distribution apparatus and a flow of a second gas to a second gas delivery channel in the gas distribution apparatus, the first gas delivery channel and second gas delivery channel formed in a plate, the first gas delivery channel having a spiral shape with a length and a plurality of apertures spaced along the length, the first gas delivery channel having at least one partition wall separating the first gas delivery channel into a plurality of first zones, each first zone having a zone length, an inlet and an outlet, the second gas delivery channel having a spiral shape with a length and a plurality of apertures spaced along the length, the second gas delivery channel having at least one partition wall separating the second gas delivery channel into a plurality of second zones, each second zone having a zone length, an inlet and an outlet.

18. The method of claim 17, further comprising exhausting gas from the plurality of first zones through the zone outlets and exhausting gas from the plurality of second zones through the zone outlets.

19. The method of claim 17, wherein the inlet of each of the first zones is in fluid communication with a first valve and first orifice and providing the flow of first gas comprises opening the first valves to allow a first gas to flow through the first valves into the first zones, and the inlet of each of the second zones is in fluid communication with a second valve and second orifice and providing the flow of second gas comprises opening the second valves to allow a second gas to flow through the second valves into the second zones.

20. The method of claim 19, further comprising providing one or more orifices to change the flow of one or more of the first gas or second gas to one or more of the zones.

* * * * *

UNITED STATES PATENT AND TRADEMARK OFFICE
CERTIFICATE OF CORRECTION

PATENT NO. : 11,186,910 B2
APPLICATION NO. : 16/568612
DATED : November 30, 2021
INVENTOR(S) : Muhannad Mustafa et al.

Page 1 of 1

It is certified that error appears in the above-identified patent and that said Letters Patent is hereby corrected as shown below:

In the Specification

Column 1, Line 29, replace "0.07 m" before "and" and after "sizes of" with "0.07 μm".

Signed and Sealed this
Eleventh Day of January, 2022

Drew Hirshfeld
*Performing the Functions and Duties of the*
*Under Secretary of Commerce for Intellectual Property and*
*Director of the United States Patent and Trademark Office*